United States Patent [19]

Karlsson

[11] Patent Number: 4,601,600

[45] Date of Patent: Jul. 22, 1986

[54] CLAMP FASTENER

[75] Inventor: Bo A. E. Karlsson, Spånga, Sweden

[73] Assignee: Telefonaktiebolaget LM Ericsson, Stockholm, Sweden

[21] Appl. No.: 621,920

[22] PCT Filed: Nov. 8, 1983

[86] PCT No.: PCT/SE83/00384

§ 371 Date: Jun. 13, 1984

§ 102(e) Date: Jun. 13, 1984

[87] PCT Pub. No.: WO84/01984

PCT Pub. Date: May 24, 1984

[30] Foreign Application Priority Data

Nov. 17, 1982 [SE] Sweden .................... 8206559

[51] Int. Cl.⁴ ............................................... F16D 1/00
[52] U.S. Cl. ..................................... 403/338; 403/399; 339/270 R

[58] Field of Search ............... 403/338, 335, DIG. 9, 403/398, 399; 24/522, 524, 525, 526; 285/406; 339/270 R, 244 R, 244 UC

[56] References Cited

U.S. PATENT DOCUMENTS

| | | | |
|---|---|---|---|
| 349,511 | 9/1886 | McKenzie, Jr. | 285/406 |
| 888,931 | 5/1908 | Robinson | 24/526 X |
| 1,843,023 | 1/1932 | Edmondson | 24/526 X |
| 2,296,782 | 9/1942 | Fischer et al. | 403/335 |
| 3,830,528 | 8/1974 | Purdy | 24/525 X |

*Primary Examiner*—Andrew V. Kundrat
*Attorney, Agent, or Firm*—Roberts, Spiecens & Cohen

[57] ABSTRACT

A clamp fastener for fastening plates (4, 5) e.g. in cabinets containing electronic equipment. The plates (4,5) are clamped together between the legs of a U-shaped member (1) having converging legs and a round rod (2) disposed in the member. The fastener gives good mechanical and electrical contact along the whole of the contact length of the plates.

4 Claims, 1 Drawing Figure

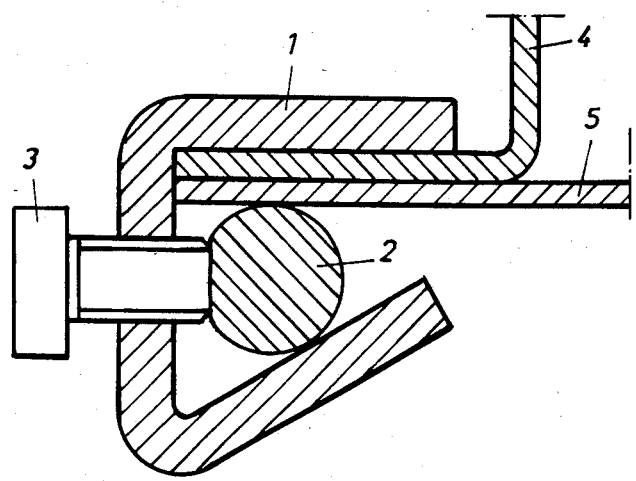

CLAMP FASTENER

FIELD OF THE INVENTION

The invention relates to a clamp fastener for achieving secure mechanical and electrical contact between two plates included in a common structure.

BACKGROUND AND PRIOR ART

Modern electronics, e.g. computers and their peripheral equipment, operate more and more quickly. As a result signals with very high frequencies are processed and transported between and within equipment. The more rapid the sequences of the operations, the more accentuated is the electromagnetic radiation from incorporated components and wiring. In order to avoid determenental effects of radiation and potential fronts it is necessary to surround the circuits and wiring with grounded metal casing.

In grounding metal casings or cabinets surrounding circuits emitting electromagnetic radiation, it is known that poor electrical contact between two individually grounded plates results in radiation from the joints between the plates. In rigid joints, the problem can be avoided e.g. by welding the plates together. Screwed connections are often used for dismantlable fastenings. For improving the electrical contact it is known to arrange sealing strips between the plates, e.g. of electrically conductive rubber. Known methods of guaranteeing good electrical contact between dismantable plates in metal cabinets are either laborious (screws) or expensive (electrically conductive rubber strip).

SUMMARY OF THE INVENTION

The present invention seeks to an effective and practical means for providing a substantially uniform pressure between two plates along their entire length of contact, thereby achieving good mechanical and electrical contact between the plates.

According to the invention there is provided a clamp fastener for clamping together at least two plates, comprising comprising an elongated member having a U-shaped cross section whose legs coverge towards each other and are intended to extend over the plates which are to be connnected to each other, and a rod intended to engage, under pressure, against one of the plates and one leg of the member by a pressure means arranged in the member to displace the rod transversely such that the plates are clamped between the rod and the other leg of the member.

BRIEF DESCRIPTION OF THE FIGURE OF THE DRAWING

The invention will now be described in detail with reference to the accompanying drawing, the sole FIGURE of which shows in cross section a joint between two plates, utilizing the clamp fastener of the invention.

PREFERRED EMBODIMENT

The drawing illustrates an embodiment of a fastener in accordance with the invention. Two plates 4 and 5 are surrounded along their common length by a U-shaped member 1.

As shown in the drawing, the U-shaped member includes a base 6 with a leg 7 extending perpendicularly from the base and a leg 8 extending from the base at an angle to converge with leg 7 towards the longitudinal opening of the member. Due to the legs of the member 1 converging towards the longitudinal opening of the member, the distance between a round rod 2, disposed in the member along its length, and the legs of the member will vary with the distance of the rod 2 from the longitudinal opening of the member. With the aid of screws 3 disposed at suitable spacing along the member, the rod 2 can be displaced in its transverse direction, thereby to clamp the plates 4 and 5 with a wedge action. The pressure obtained in this way between the plates 4 and 5 has been found to result in an excellent electrical "sealing" of metal cabinets while a good mechanical joint is obtained at the same time.

What is claimed is:

1. A clamp fastener for clamping two plates together comprising an elongated member of U-shaped cross-section including a base and two legs extending from said base to converge towards one another, the plates which are to be clamped together being disposed as a unit between said legs in contact with one of said legs, a rod disposed between said legs for and configured for tangentaily contacting the plates and the other of said legs, said rod being displaceable between said legs to vary the distance between the rod and the base and pressure means supported by said elongated member for displacing said rod away from said base to press said plates together by a wedging action of the rod between the convergent lens.

2. A clamp fastener as claimed in claim 1 wherein a first of said legs extends perpendicularly to said base and the second of said legs extends at an angle thereto towards said first leg.

3. A clamp fastener as claimed in claim 2 wherein said rod has a round cross-section.

4. A clamp fastener as claimed in claim 3 wherein said pressure means comprises a threaded member in said base bearing against said rod to displace said rod to cause the rod to ride on said second leg and press said plates together and against said first leg to achieve mechanical and electrical contact between said plates.

* * * * *